US006993836B2

(12) United States Patent
Takenaka et al.

(10) Patent No.: US 6,993,836 B2
(45) Date of Patent: Feb. 7, 2006

(54) CIRCUIT BOARD AND METHOD OF MANUFACTURING SAME

(75) Inventors: Toshiaki Takenaka, Kyoto (JP); Toshihiro Nishii, Hirakata (JP); Shigeru Yamane, Hirakata (JP); Shinji Nakamura, Katano (JP); Hideaki Komoda, Hirakata (JP); Kunio Kishimoto, Katano (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 152 days.

(21) Appl. No.: 10/648,187

(22) Filed: Aug. 27, 2003

(65) Prior Publication Data

US 2004/0035604 A1 Feb. 26, 2004

Related U.S. Application Data

(62) Division of application No. 09/928,966, filed on Aug. 14, 2001, now Pat. No. 6,700,071.

(30) Foreign Application Priority Data

Aug. 17, 2000 (JP) .............................. 2000-247332

(51) Int. Cl.
*H01K 3/10* (2006.01)

(52) U.S. Cl. ........................... 29/852; 29/825; 29/830; 29/846

(58) Field of Classification Search ................... 29/825, 29/830, 846, 850, 831, 853

See application file for complete search history.

(56) References Cited

U.S. PATENT DOCUMENTS

| | | | |
|---|---|---|---|
| 4,967,314 A | 10/1990 | Higgins, III | |
| 5,072,075 A | 12/1991 | Lee et al. | |
| 5,200,580 A | 4/1993 | Sienski | |
| 5,219,639 A | 6/1993 | Sugawara et al. | |
| 5,245,135 A | 9/1993 | Schreiber et al. | |
| 5,259,110 A | 11/1993 | Bross et al. | |
| 5,276,955 A | 1/1994 | Noddin et al. | |
| 5,315,072 A | 5/1994 | Arai et al. | |
| 5,350,886 A | 9/1994 | Miyazaki et al. | |
| 5,478,972 A | 12/1995 | Mizutani et al. | |
| 5,517,751 A * | 5/1996 | Bross et al. ................... 29/830 |
| 6,528,733 B2 * | 3/2003 | Takenaka et al. ........... 174/255 |
| 6,532,651 B1 * | 3/2003 | Andou et al. .................. 29/852 |
| 6,630,630 B1 * | 10/2003 | Maezawa et al. ........... 174/262 |
| 6,748,652 B2 * | 6/2004 | Andou et al. .................. 29/852 |
| 6,839,964 B2 * | 1/2005 | Henson ........................ 29/852 |

FOREIGN PATENT DOCUMENTS

| | | | |
|---|---|---|---|
| EP | 0 793 405 A2 | 9/1997 | |
| EP | 0 961 533 A2 | 12/1999 | |

(Continued)

*Primary Examiner*—Carl J. Arbes
(74) *Attorney, Agent, or Firm*—McDermott Will & Emery LLP

(57) ABSTRACT

A circuit board having stable connection resistance can be obtained. The multi-layer circuit board includes the steps of making through-holes in a incompressible substrate having films on either side thereof via a bonding layer; filling conductive paste into the through-holes; removing the films from the substrate; laminating metallic foils to either side of the substrate and heating same under pressures to harden the bonding layer, bonding the metallic foils to the substrate and electrically connecting the sides of the substrate to each other; and forming a circuit pattern by machining the metallic foils.

22 Claims, 8 Drawing Sheets

FOREIGN PATENT DOCUMENTS

| | | |
|---|---|---|
| JP | 07-147464 A | 6/1995 |
| JP | 08-78803 A | 3/1996 |
| JP | 8-316598 A | 11/1996 |
| JP | 10-56267 A | 2/1998 |
| JP | 11-087870 A | 3/1999 |
| JP | 2000-156566 A | 6/2000 |

* cited by examiner (a)

(b)

(c)

(d)

(e)

CIRCUIT BOARD AND METHOD OF MANUFACTURING SAME

This is a divisional of 09/928,966 filed on Aug. 14, 2001 now U.S. Pat. No. 6,700,071.

FIELD OF THE INVENTION

The present invention relates to a multi-layer circuit board with at least two or more layers of circuit patterns connected, and a method of manufacturing same.

BACKGROUND OF THE INVENTION

With a recent trend of electronic equipment becoming more miniaturized and higher in component density, there is an increasing demand for multi-layered circuit boards in the fields of both industrial and home-use equipment.

In the field of such multi-layer circuit board, there is a strong demand for the development of a method of making inner via-hole connection between multi-layered circuit patterns, and a circuit board having a highly reliable structure. As a method of manufacturing such circuit board, Japanese Laid-open Patent No. 6-268345 is proposing a method of manufacturing a high density circuit board having a novel structure wherein inner via-hole connections are made by conductive paste. This conventional method of manufacturing a circuit board will be described in the following.

A method of manufacturing a circuit board having four layers as a prior art multi-layer circuit board is described in the following.

First, a method of manufacturing a double-side circuit board being the base for a multi-layer circuit board is described.

FIG. 7 is a sectional view of the process for a conventional method of manufacturing double-side circuit boards for inner layers. In FIG. 7, the substrate is formed of prepreg sheet 21. The prepreg sheet 21 has a shape of 250 mm sq. and about 150 μm thick. For example, the prepreg sheet 21 is formed of a composite material having non-woven fabric made from aromatic polyamide fiber and thermosetting epoxy resin impregnated to the non-woven fabric. Releasing films 22a, 22b have a plastic film and a Si type releasing agent applied to one side of the film, and the releasing films 22a, 22b are about 16 μm in thickness. For example, as plastic film, polyethylene terephthalate is employed.

A method of bonding the prepreg 21 and releasing film 22a, 22b together is disclosed in Japanese Laid-open Patent No. 7-106760. Japanese Laid-open Patent No. 7-106760 refers to a method of continuously bonding releasing films 22a, 22b by dissolving the resin component of prepreg 21 with the use of a laminating apparatus.

A through-hole 23 is formed in the pregreg sheet 21 and releasing films 22a, 22b bonded together. The through-hole 23 is filled with conductive paste 24. Metallic foils 25a, 25b such as copper of 18 μm thick are bonded to either side of the prepreg sheet 21. The conductive paste 24 is electrically connected to the metallic foil 25a, 25b.

In FIG. 7, (a) the releasing films 22a, 22b are bonded to either side of the prepreg sheet 21. Next, (b) the through-holes 23 are formed, at predetermined portions, in the prepreg sheet 21 with the releasing films 22a, 22b bonded thereto, by using a laser beam machining process.

Next, (c) the conductive paste 24 is filled into the through-holes 23. In the method of filling the conductive paste 24, the prepreg sheet 21 having the through-holes 23 is placed on the table of a printer (not shown) and the conductive paste 24 is directly printed on the releasing film 22a. In this case, the releasing films 22a, 22b serve a function as a printing mask and also a function to prevent contamination of the prepreg sheet 21.

Subsequently, (d) the releasing films 22a, 22b are removed from either side of the prepreg sheet 21.

Next, (e) the metallic foils 25a, 25b are laminated to either side of the prepreg sheet 21. And the laminated metallic foils 25a, 25b and prepreg sheet 21 are heated under pressures at a temperature of about 200° C. and pressure of about 4 MPa for one hour in a vacuum.

In this way, (f) the prepreg sheet 21 is compressed and becomes reduced in thickness (t2) to approximately 100 μm. At the same time, the prepreg sheet 21 and metallic foils 25a, 25b are bonded to each other. Further, the metallic foil 25a disposed on the surface side and the metallic foil 25b disposed on the back side are electrically connected to each other by the conductive paste 24 filled in the through-holes 23 formed at the predetermined positions.

After that, the metallic foils 25a, 25b are selectively etched, and then circuit patterns 31a, 31b are formed respectively on either side thereof. Thus, a double-side circuit board can be obtained.

FIG. 8 is a sectional view of the process for a conventional method of manufacturing a multi-layer circuit board, and the multi-layer circuit board is a four-layer circuit board.

In FIG. 8(a), a double-side circuit board 40 having circuit patterns 31a, 31b manufactured by the steps from (a) to (g) of FIG. 4 and prepreg sheets 21a, 21b with conductive paste 24 filled in through-holes 23 manufactured by the steps from (a) to (d) of FIG. 7 are prepared.

Next, as shown in FIG. 8(b), metallic foil 25b, prepreg sheet 21b, inner layer double-side circuit board 40, prepreg sheet 21a, and metallic foil 25a are positioned and laminated in this order.

Subsequently, the laminated board formed of these is heated under pressures at a temperature of about 200° C. and pressure of about 4 MPa for one hour in a vacuum, thereby curing the prepreg sheets 21a, 21b. Thus, as shown in FIG. 8(c), the prepreg sheets 21a, 21b are compressed and become reduced in thickness (t2) to 100 μm, then the double-side circuit board 40 and metallic foils 25a, 25b are bonded to each other. The circuit pattern 31a and circuit pattern 31b of the double-side circuit board 40 are connected to the metallic foils 25a, 25b by inner via-holes filled with conductive paste 24. Next, as shown in FIG. 8(d), the metallic foils 25a, 25b are selectively etched, thereby forming the circuit patterns 32a, 32b. In this way, a circuit board having four layers can be obtained.

However, in the above conventional method of manufacturing a circuit board, a prepreg sheet formed of half-cured resin are heated under pressures to bond the prepreg sheet to a metallic foil and also to harden the prepreg sheet. In this case, during heating under pressures, a cushion is generally used as an intermediate material to compensate for variation in thickness of the prepreg sheet. However, due to variation in quantity and fluidity of the resin contained in the prepreg sheet, the peripheral resin excessively flows during heating under pressures, resulting in insufficient application of the pressure to the central portion of the substrate, and accordingly, the conductive paste will not be sufficiently compressed. As a result, there has been a problem of fluctuation in connection resistance.

SUMMARY OF THE INVENTION

A multi-layer circuit board of the present invention comprises:

(a) a double-side circuit board including a first substrate, a plurality of first through conductors disposed in the first substrate, bonding layers disposed on either side of the first substrate, and a first circuit pattern and a second circuit pattern disposed on the surface of the bonding layer, wherein the first circuit pattern and the second circuit pattern are electrically connected to each other by the first through conductors;

(b) an intermediate substrate including a second substrate, a plurality of second through conductors disposed in the second substrate, and a first bonding layer and a second bonding layer disposed on either side of the second substrate, wherein the first bonding layer and the second bonding layer are disposed on either side of the substrate except the second through conductors, and the intermediate substrate is disposed on the surface of at least one of the first circuit pattern and the second circuit pattern.

By the above configuration, the through conductors disposed between the respective circuit patterns become uniform in connection resistance, and consequently, a circuit board having a stable connection resistance can be obtained.

A method of manufacturing a circuit board of the present invention comprises the steps of:

(a) manufacturing an intermediate substrate, including the steps of:
  (i) forming a substrate having incompressibility;
  (ii) forming bonding layers on either side of the substrate;
  (iii) forming a plurality of through-holes in the substrate; and
  (iv) filling conductive paste into the through-holes,
(b) manufacturing a double-side circuit board, including the steps of:
  (v) laminating metallic foils to either side of the intermediate substrate and heating same under pressures, and
  (vi) forming a first circuit pattern and a second circuit pattern by processing the metallic foils.

By the above configuration, the conductors electrically connecting the first circuit pattern and the second circuit pattern to each other become uniform in connection resistance, and consequently, a circuit board having a stable connection resistance can be obtained.

DESCRIPTION OF THE REFERENCE NUMERALS

Figure 1:
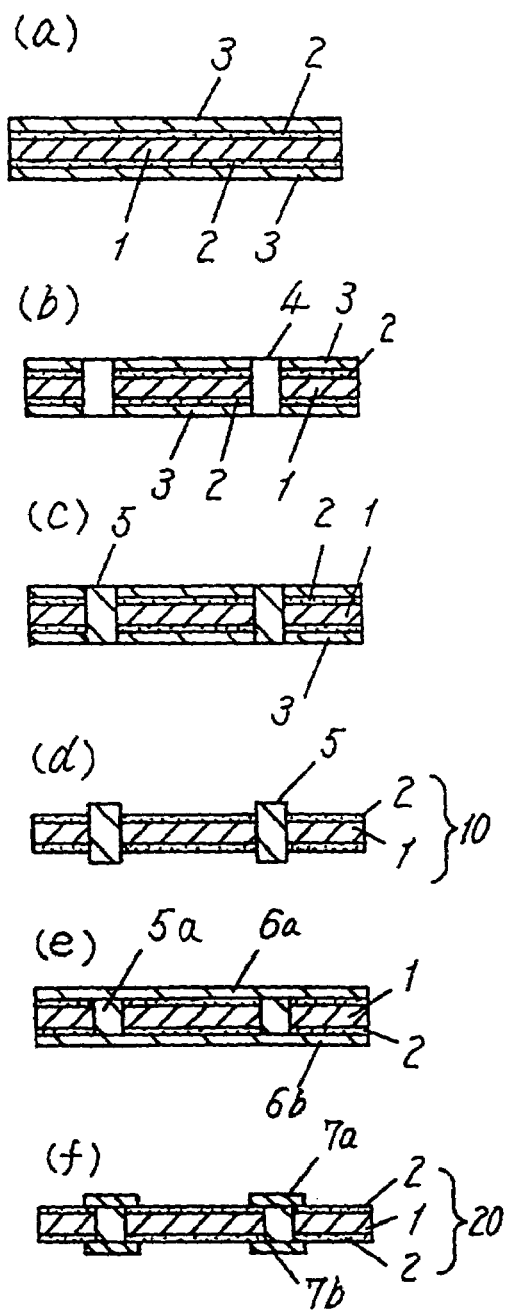
FIG. 1 is a sectional view of the process showing a method of manufacturing a double-side circuit board used for a circuit board in one embodiment of the present invention.

1 Substrate
2 Bonding layer
2a First bonding layer
2b Second bonding layer
3 Releasing film
4 Through-hole
5 Conductive paste
5a Through conductor
6a First metallic foil
6b Second metallic foil
6c Third metallic foil
6d Fourth metallic foil
7a First circuit pattern
7b Second circuit pattern
8a Third circuit pattern
8b Fourth circuit pattern
9 Smoothing layer
10 Intermediate substrate
10a First intermediate substrate
10b Second intermediate substrate
14 Non-through-hole
20 Double-side circuit board
20a First double-side circuit board
20b Second double-side circuit board
30a First bonding substrate
30b Second bonding substrate

DETAILED DESCRIPTION OF THE INVENTION

A multi-layer circuit board of the present invention comprises:

(a) a double-side circuit board including a first substrate, a plurality of first through conductors disposed in the first substrate, bonding layers disposed on either side of the first substrate, and a first circuit pattern and a second circuit pattern disposed on the surface of the bonding layer, in which the first circuit pattern and the second circuit pattern are electrically connected to each other by the first through conductors;

(b) an intermediate substrate including a second substrate, a plurality of second through conductors disposed in the second substrate, and a first bonding layer and a second bonding layer disposed on either side of the second substrate, in which the first bonding layer and the second bonding layer are disposed on either side of the substrate except the second through conductors, and the intermediate substrate is disposed on the surface of at least one of the first circuit pattern and the second circuit pattern.

Preferably, the bonding layer is connected to at least one of the first bonding layer and the second bonding layer, while the intermediate substrate and the double-side circuit board are connected to each other.

Preferably, the multi-layer circuit board of the present invention further comprises:

(c) an additional circuit pattern disposed on the surface of the intermediate substrate, the additional circuit pattern being electrically connected to at least one of the first circuit pattern and the second circuit pattern by the second through conductors.

A method of manufacturing a circuit board of the present invention comprises the steps of:

(a) manufacturing an intermediate substrate, including the steps of:
  (i) forming a substrate having incompressibility,
  (ii) forming bonding layers on either side of the substrate,
  (iii) forming a plurality of through-holes in the substrate, and
  (iv) filling conductive paste into the through-holes; and
(b) manufacturing a double-side circuit board, including the steps of:
  (v) laminating metallic foils to either side of the intermediate substrate and heating same under pressures, and
  (vi) forming a first circuit pattern and a second circuit pattern by machining the metallic foils.

Preferably, the step of manufacturing the intermediate substrate comprises a step of filling the conductive paste into the through-holes so that the conductive paste is protruded from the surface of the bonding layer, thereby forming a protrusion of the conductive paste, in the step (v), the protrusion of the conductive paste is compressed by the metallic foils, and the metallic foils disposed on either side of the intermediate substrate are electrically connected to each other by the conductive paste in the through-holes.

By this method, resin streak is stabilized during heating under pressures. As a result, a circuit board having a stable connection resistance can be obtained.

A method of manufacturing a circuit board in one embodiment of the present invention comprises the steps of:
  making through-holes in an incompressible substrate having film material on either side thereof via a bonding layer;
  filling conductive paste into the through-holes;
  peeling off the film material from the substrate;
  laminating metallic foils to either side of the substrate and heating same under pressures to harden the bonding layer and to bond the metallic foils to the substrate, establishing an electrical connection between the sides of the substrate; and
  forming a circuit pattern by machining the metallic foil.

Due to this method, only the bonding layer on the substrate is to be deformed during heating under pressures. Accordingly, resin streak is reduced at the periphery of the substrate, and thereby, the conductive paste is uniformly pressurized. As a result, a circuit board having stable connection resistance can be obtained.

Preferably, the substrate has incompressibility. Thus, as compared to a prepreg sheet formed of half-cured resin, the substrate is higher in strength and is less deformed due to pressures during resin curing of the bonding layer in the process of manufacturing a circuit board, and consequently, it is possible to improve the coincidence between land and via.

A method of manufacturing a circuit board in one embodiment of the present invention comprises the steps of:

alternately positioning and laminating a plurality of insulating substrates and circuit boards having through-holes therein in a manner such that the outermost layer is the insulating substrate;
  disposing metallic foils on either side thereof;
  heating the whole under pressures; and
  forming a circuit pattern on the metallic foil.

By this method, the connection resistance will be stabilized, and a multi-layer circuit board improved in coincidence between land and via can be obtained.

Preferably, the substrate has incompressibility. The substrate is a composite material of woven or non-woven fabric and thermosetting resin, based on inorganic material or aromatic polyamide. The composite material is cured by heating under pressures. By this configuration, the substrate is improved in incompressibility. Further, by selecting a material having excellent laser workability, the circuit board is enhanced in density and in wiring storage capacity, and moreover, a circuit board having excellent physical and environmental characteristics can be obtained.

Preferably, a circuit board having two or more layers of circuit patterns is a circuit board with interlayer connection already provided. The amount of conductive paste protruded is controlled according to the thickness of releasing film or film material. In this way, even when the substrate is changed in thickness, the conductive paste is uniformly compressed. As a result, stable connection resistance can be obtained.

Preferably, resin streak on the bonding layer is reduced. The bonding layer is in a range of about 5 $\mu$m to about 15 $\mu$m in thickness. Thus, the variation in resistance of the through-holes will be lessened.

In a circuit board having no smoothing layer in circuit pattern concavities of a circuit board having at least two layers of circuit patterns, the bonding layers on the surface and back sides are different in thickness, and only the bonding layer adhering to the circuit pattern concavities is thicker. That is, the bonding layers disposed on either side of the substrate are different in thickness. By this configuration, resin streak during lamination can be minimized. As a result, the connection resistance can be stabilized.

Preferably, the step of forming the substrate having incompressibility further includes a step of roughening the surface of the substrate before forming the bonding layer. That is, the surface of the substrate having incompressibility is roughened before the bonding layer is formed. Thus, the bonding strength between the substrate and the bonding layer will be enhanced due to anchor effect.

Preferably, the step of forming the substrate having incompressibility further includes a step of eliminating the residual stresses. That is, the substrate is used after eliminating the residual stresses generated during the manufacture of the incompressible substrate. As a result, the incompressible substrate becomes free from strain, and further, the coincidence between land and via can be improved.

The step of forming the substrate having incompressibility further includes a step of heat-treating the substrate at the glass transition temperature of the resin contained in the substrate. In this way, the residual stresses can be eliminated from the substrate.

Preferably, a method of manufacturing a circuit board further comprises:
  a step of disposing a smoothing layer on the bonding layer in the circuit pattern concavities of at least one circuit pattern of the first circuit pattern and the second circuit pattern of the double-side circuit board. That is, the smoothing layer is formed on the bonding layer where no circuit pattern is formed. Thus, the resin to fill up the concavities where no circuit pattern is formed becomes unnecessary. Accordingly, the quantity of resin in the bonding layer may be reduced, and also, resin streak generated at the periphery of the substrate during heating under pressures will be reduced. As a result, stable connection resistance can be obtained.

Preferably, the smoothing layer is formed of cured resin or half-cured resin.

An exemplary embodiment of the present invention will be described in the following with reference to FIG. 1 to FIG. 6.

Exemplary Embodiment 1:

The first exemplary embodiment of the present invention for a method of manufacturing a circuit board is described here.

Figure 2:
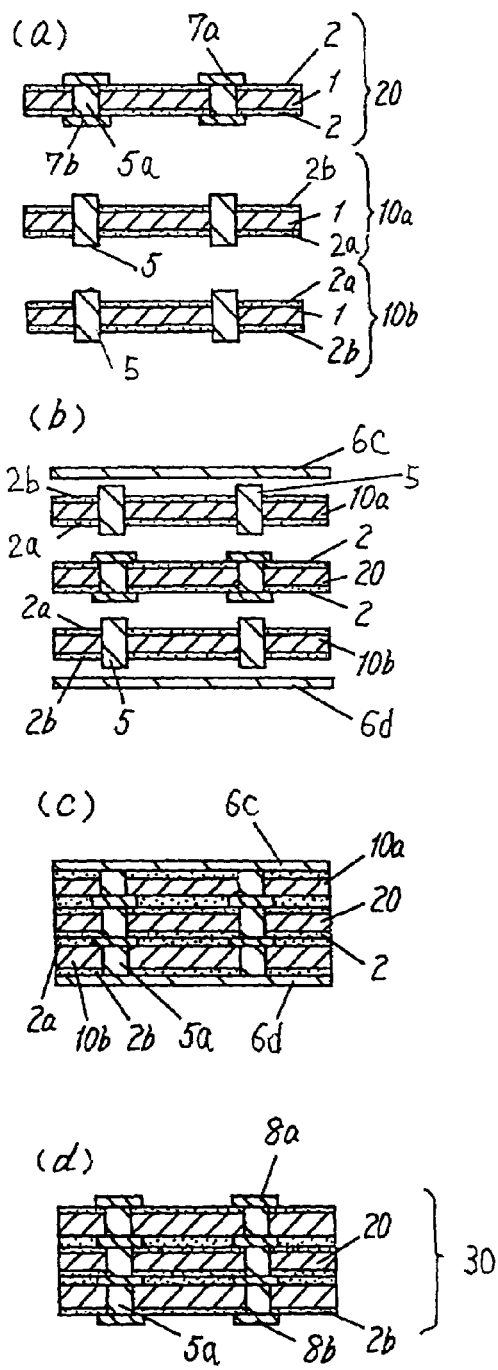
FIG. 2 is a sectional view of the process showing a method of manufacturing the first multi-layer circuit board of circuit boards in one embodiment of the present invention.
Figure 3:
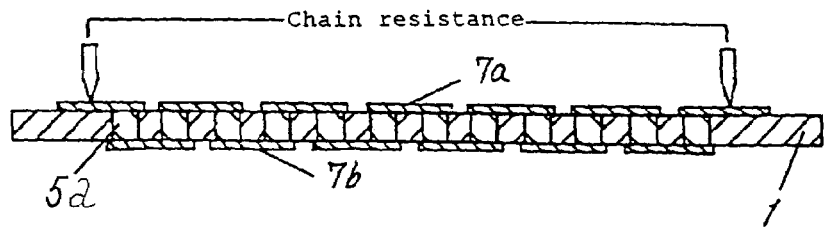
FIG. 3(a) is a sectional view of a circuit board for resistance measurement.
FIG. 3(b) is a plan view of the circuit board of FIG. 3(a).
FIG. 3(c) is a graphical representation of characteristics showing the chain resistance values at the substrate positions of a double-side circuit board used for a circuit board in one embodiment of the present invention.
Figure 3:
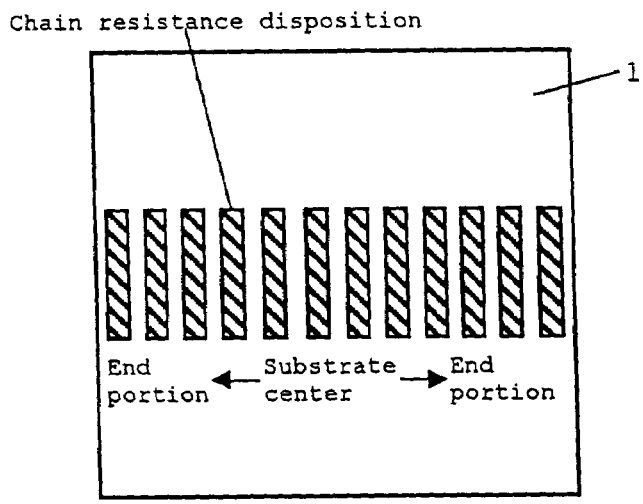
Figure 3:
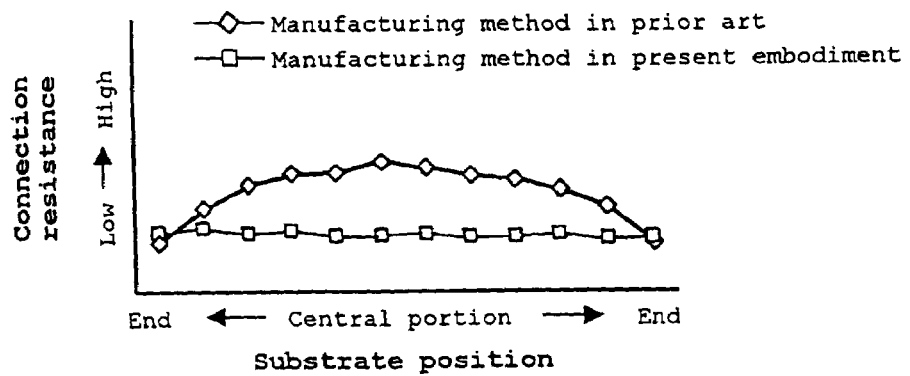

FIG. 1 is a sectional view of the process for a method of manufacturing a double-side circuit board used for the circuit board in one embodiment of the present invention. FIG. 2 is a sectional view of the process for a method of manufacturing a multi-layer circuit board used for the circuit board in one embodiment of the present invention, showing an example of 4-layer circuit board.

First, a method of manufacturing a double-side circuit board used for the multi-layer circuit board will be described.

In FIG. 1, substrate 1 is 250 mm square and about 80 $\mu$m in thickness, having incompressibility. The substrate 1 is formed of composite material having non-woven fabric of aromatic polyamide fiber, and thermosetting epoxy resin impregnated to the non-woven fabric.

The first method of forming the substrate 1 is such that the composite material is heated under pressures while sandwiching both sides of the composite material with metallic foils. In this way, the thermosetting epoxy resin hardens, and the metallic foils adhere to the substrate. After that, the metallic foils are removed by etching.

Preferably, in the first method, the surfaces of the metallic foils sandwiching the composite material are previously roughened. Thus, roughened surfaces are formed on either side of the substrate 1 after removal of the metallic foils by etching. Accordingly, as stated later, the bonding strength between the substrate 1 and the bonding layer 2 may be enhanced.

The second method of forming the substrate 1 is such that the composite material is heated under pressures while sandwiching both sides of the composite material with heat resisting films. After that, the heat resisting films are removed. As a heat resisting film, for example, Teflon or polyamide film is employed.

Releasing films 3 are bonded via bonding layer 2 to either side of the substrate 1 thus formed. That is, in FIG. 1(a), releasing films 3 are bonded to either side of the substrate 1 by the bonding layers 2.

The bonding layer 2 is, for example, thermosetting epoxy resin in the B stage, and about 10 $\mu$m in thickness.

The releasing film 3 includes plastic film, and Si type releasing agent applied to one side of the film, and is about 16 $\mu$m in thickness. As the plastic film, for example, polyethylene phthalate is employed.

The releasing film 3 is 16 $\mu$m in thickness, but the thickness of the releasing film 3 is changed according to the thickness of the substrate 1.

As the first method of disposing the bonding layer 2, the bonding layer 2 is disposed on the surface of the releasing film 3. For example, a bonding agent having epoxy resin diluted to a specified viscosity level with a solvent such as methyl ethyl ketone is applied to the releasing surface of the releasing film 3 by means of a roll coater, and the applied bonding agent is dried. In this way, the bonding layer 2 is disposed on the surface of the releasing film 3.

Also, as another method of disposing the bonding layer 2, the bonding layers 2 are disposed on either side of the substrate 1. For example, a bonding agent containing epoxy resin diluted to a specified viscosity level with a solvent such as methyl ethyl ketone is applied in a specific thickness to both sides of the substrate 1 by means of a roll coater or dipping method, and the applied bonding agent is dried. In this way, the bonding layers 2 are disposed on either side of the substrate 1.

In each of the above methods, the incompressible substrate 1 and the releasing film 3 are bonded to each other by melting the bonding layer 2 with use of a laminating apparatus.

In FIG. 1(b), through-hole 4 is formed in the substrate 1 and releasing film 3 bonded to each other. Preferably, a plurality of through-holes 4 are formed at the specified positions. That is, the through-holes 4 are formed by laser beam machining or the like in the predetermined portions of the substrate 1 with releasing films 3 bonded to either side thereof by the bonding layers 2. Or, the through-holes 4 are formed by drilling or the like.

Next, in FIG. 1(c), conductive paste 5 is filled into the through-holes 4. For example, the substrate 1 having through-holes 4 is placed on a table of a printer (not shown), and the conductive paste 5 is directly printed on the releasing film 3. In this case, the releasing film 3 serves a function as a printing mask and also serves a function to prevent contamination of the substrate 1.

The conductive paste 5 contains a conductive filler and resin. For example, as a conductive filler, copper powder of 2 $\mu$m in average grain size is used, and as resin, thermosetting epoxy resin (non-solvent type) and hardening agent are used. As the hardening agent, it is preferable to use an acid anhydride type hardening agent. For example, the conductive paste 5 is formed by kneading 85% by weight of copper powder, 12.5% by weight of thermosetting epoxy resin, and 2.5% by weight of acid anhydride type hardening agent by using three rolls.

Preferably, the through-holes 4 are a plurality of through-holes, and when the conductive paste 5 is filled in each of the through-holes 4, the releasing film 3 used has a thickness that is optional in accordance with the thickness of the substrate 1. Thus, the conductive past 5 can be uniformed in compressibility.

Next, as shown in FIG. 1(d), the releasing film 3 is peeled off from the substrate 1. After the releasing film 3 is removed, the conductive paste 5 equivalent in thickness to the releasing film 3 is formed in a state of protruding from the surface of bonding agent 2. In this way, intermediate substrate 10 is manufactured. That is, the intermediate substrate 10 includes the substrate 1, the bonding layers 2 disposed on either side of the substrate, and the conductive paste 5 filled in the through-holes.

Also, first metallic foil 6a and second metallic foil 6b are prepared. As such metallic foils, copper foils are used. The copper foil is about 300 mm square and 12 $\mu$m in thickness.

As shown in FIG. 1(e), the first metallic foil 6a and the second metallic foil 6b are laminated to either side of the substrate 1, and are subsequently heated under pressures at a temperature of about 200° C. and a pressure of about 4 MPa for one hour in a vacuum or inert gas. Thus, the bonding layer 2 hardens, and the substrate 1 is bonded to the metallic foils 6a, 6b. At the same time, the protruding conductive paste 5 is compressed, and the conductive paste is hardened to form through conductor 5a. In this way, the first metallic foil 6a and the second metallic foil 6b disposed on either side of the substrate 1 are electrically connected to each other by the through conductor 5a formed in the through-hole 4.

Next, as shown in FIG. 1(f), the first metallic foil 6a is selectively etched to form a first circuit pattern 7a. Similarly, the second metallic foil 6b is selectively etched to form a second circuit pattern 7b. In this way, a double-side circuit board 20 is formed.

Also, a method of manufacturing a multi-layer circuit board using a double-side circuit board thus formed is described with reference to FIG. 2. An example of a four-layer circuit board having four layers of circuit patterns will be described in the following.

FIG. 2 is a sectional view of the process showing a method of manufacturing a multi-layer circuit board.

As shown in FIG. 2(a), the double-side circuit board 20, first intermediate substrate 10a, and second intermediate substrate 10b are prepared.

The double-side circuit board 20 is manufactured by a process shown in FIG. 1 described above. The first circuit pattern 7a is disposed, by the bonding layer 2, on the first surface side of the substrate 1. The second circuit pattern 7b is disposed, by the bonding layer 2, on the second surface side of the substrate 1. The first circuit pattern 7a and the second circuit pattern 7b are electrically connected to each other by the through conductor 5a disposed in the through-hole.

The first intermediate substrate 10a and the second intermediate substrate 10b are prepared. These intermediate substrates 10a, 10b are nearly same in configuration as the intermediate substrate 10 shown in FIG. 1(d) described above. That is, each of the first intermediate substrate 10a and the second intermediate substrate 10b includes the substrate 1, first bonding layer 2a and second bonding layer 2b disposed on either side of the substrate, and the conductive paste 5 disposed in the through-hole. However, the first bonding layer 2a and the second bonding layer 2b are different in thickness. The conductive paste 5 are protruding from the surfaces of the respective bonding layers 2a, 2b. Each of the bonding layers 2a, 2b is resin in the B stage, and the thickness of each bonding layer is preferable to be in a range from about 10 μm to about 15 μm. Each bonding layer contains thermosetting resin such as epoxy resin. The B stage is a stage of being half-cured of thermosetting resin.

In FIG. 2(a), the first circuit pattern 7a and the second circuit pattern 7b are 12 μm in thickness. The first bonding layer 2a and the second bonding layer 2b are respectively about 15 μm and 10 μm in thickness.

Next, as shown in FIG. 2(b), fourth metallic foil 6d, second intermediate substrate 10b, double-side circuit board 20, first intermediate substrate 10a, and third metallic foil 6c are positioned and laminated in this order.

The third metallic foil 6c is placed on the second bonding layer 2b side of first intermediate substrate 10a, while the first bonding layer 2a side of first intermediate substrate 10a is placed on the first circuit pattern 7a side of double-side circuit board 20. The fourth metallic foil 6d is placed on the second bonding layer 2b side of second intermediate substrate 10b, while the first bonding layer 2a side of second intermediate substrate 10b is placed on the second circuit pattern 7b side of double-side circuit board 20. That is, the first bonding layer 2a side being greater in thickness is laminated onto the double-side circuit board 20, while the second bonding layer 2b side being less in thickness is laminated onto the metallic foil 6c, 6d. Since the first bonding layer 2a side having a greater thickness is laminated to the double-side circuit board 20, the first bonding layers 2a may fill up the concavities of the first circuit pattern 7a and the second circuit pattern 7b.

Next, as shown in FIG. 2(c), these laminated members are heated under pressures at a temperature of about 200° C. and a pressure of about 4 MPa for one hour in a vacuum or inert gas. In this way, the conductive paste 5 protruding from the surface of bonding layer 2a, 2b is compressed and hardened, thereby forming through conductor 5a. At the same time, each of the bonding layers 2a, 2b is hardened. Thus, the double-side circuit board 20 and the metallic foils 6c, 6d are bonded to each other, and also, the circuit patterns 7a, 7b establish inner via-hole connections with the respective metallic foils 6c, 6d via the through conductor 5a. Further, a laminated structure is manufactured in a state such that the concavities of the first circuit pattern 7a and the second circuit pattern 7b are filled up with the first bonding layers 2a.

Also, as shown in FIG. 2(d), the metallic foils 6c, 6d disposed on either side of the laminated body are selectively etched to form the third circuit pattern 8a and the fourth circuit pattern 8b. In this way, a multi-layer circuit board 30 having four layers of circuit patterns is obtained.

Instead of the double-side circuit board, by using the multi-layer circuit board 30 manufactured as described above and also a required number of intermediate substrates, and by laminating the multi-layer circuit board 30 and the intermediate substrates in the same way as described above, it is possible to obtain a multi-layer circuit board having four or more layers of circuit patterns.

FIG. 3(a) is a sectional view of a circuit board for measuring the resistance values of the circuit board. FIG. 3(b) shows a plan view of same. FIG. 3(c) shows the chain resistance (connection resistance) at the substrate positions of a double-side circuit board obtained by the present exemplary embodiment mentioned above and of a double-side circuit board obtained by a conventional manufacturing method.

Figure 7:
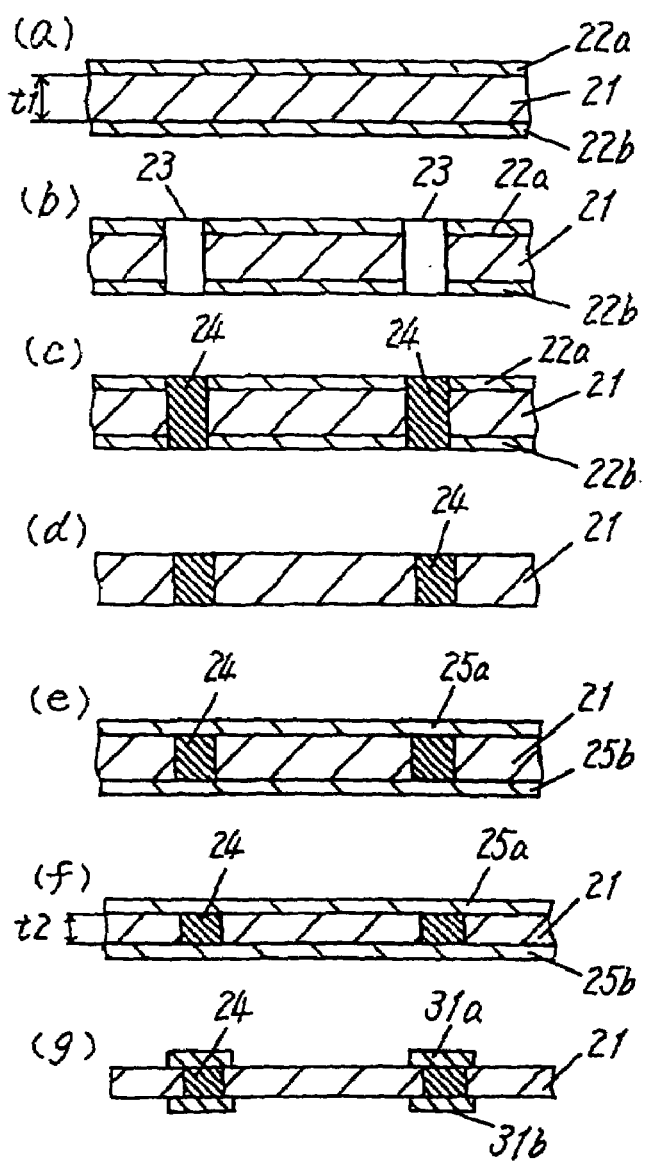
FIG. 7 is a sectional view of the process showing a method of manufacturing a double-side circuit board used for a circuit board in a prior art example.
Figure 8:
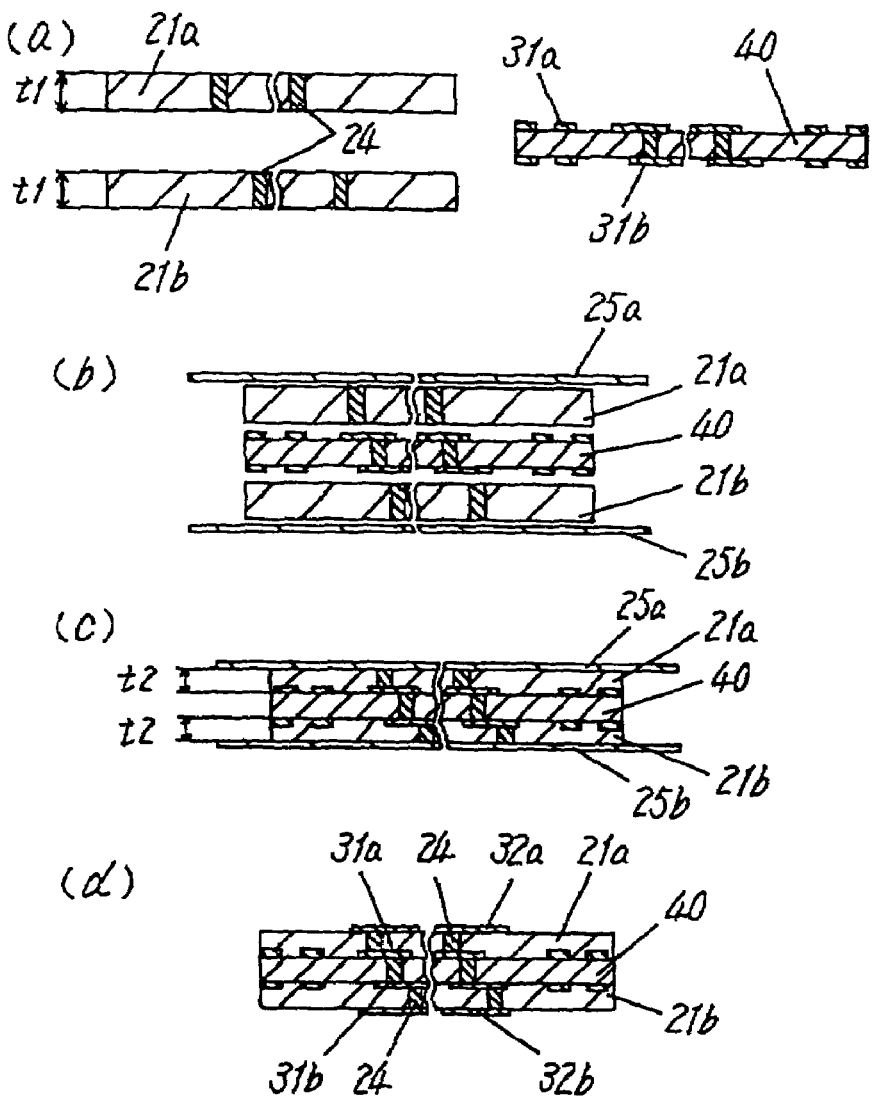
FIG. 8 is a sectional view of the process showing a method of manufacturing a multi-layer circuit board in a prior art example.

The prior art manufacturing method is, as shown in FIG. 7, a method of forming circuit patterns on a substrate by using a prepreg sheet.

As shown in FIG. 3(c), the resistance of a conventional circuit board manufactured by using a prepreg sheet having much resin is higher at the central portion of the substrate and lower at the end portion of the substrate. The substrate at the central portion of the conventional circuit board is about 10 μm thicker as compared with the end portion. Accordingly, when the prepreg sheet is heated under pressures, the resin streak becomes uneven at the end portion of the substrate or the prepreg itself is compressed, and the pressures are not evenly applied to the substrate. As a result, the resistance varies with the positions of the circuit board.

On the other hand, the resistance of the circuit board in the present embodiment using an incompressible substrate is identical at all positions of the circuit board. In addition, the circuit board of the present embodiment is identical in thickness at all positions thereof.

Figure 4:
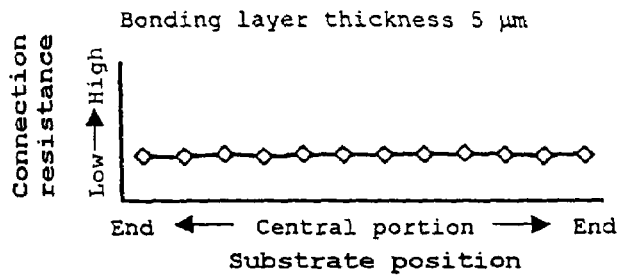
FIG. 4 is a graphical representation of characteristics showing the relationship between resin quantity and resistance of bonding layers used for a circuit board in one embodiment of the present invention.
Figure 4:
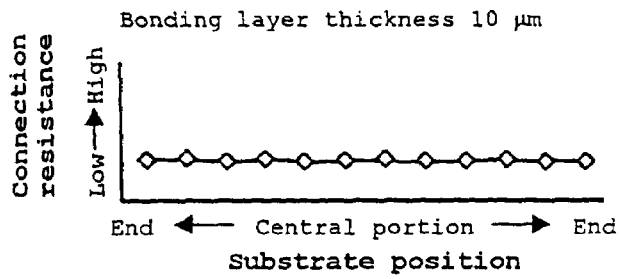
Figure 4:
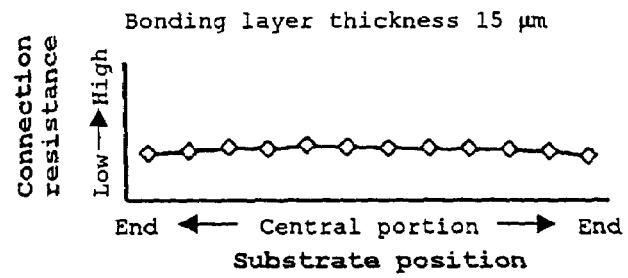
Figure 4:
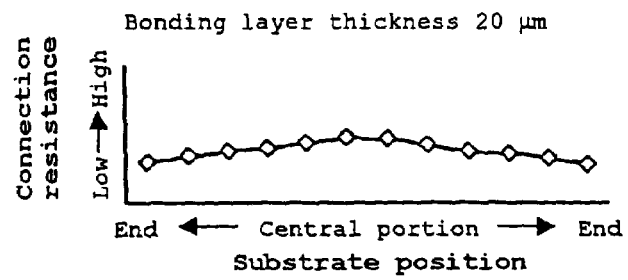
Figure 4:
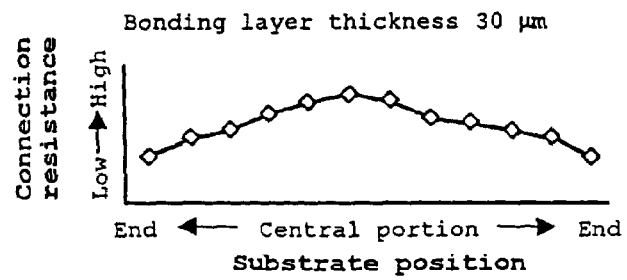

Next, a variety of circuit boards having various bonding layers different in thickness were manufactured, and the contact resistance of each circuit board was measured. The results of the measurements are shown in FIG. 4. That is, it has been confirmed that the quantity of resin on the bonding layer is closely related to the resistance. The connection resistance values were measured with respect to circuit boards having bonding layers of 5 μm, 10 μm, 15 μm, 20 μm, and 30 μm in thickness.

As shown in FIG. 4(a), FIG. 4(b) and FIG. 4(c), the circuit board having a bonding layer of 5 μm, 10 μm or 15 μm thick is identical in resistance at all positions of the circuit board. That is, all the positions of the circuit board are uniform in connection resistance.

On the other hand, as shown in FIG. 4(e), the circuit board having a bonding layer of 30 μm thick is higher in resistance at the central position rather than at the end position of the circuit board. That is, the connection resistance varies with the positions of the substrate.

Also, the resistance at the central position of the substrate becomes higher with increase in thickness of the bonding layer, causing the difference in thickness to become greater between the central position and the end position of the substrate.

From these experimental results, it is preferable to use bonding layers less in thickness because of being uniform in connection resistance. That is, the thickness of a bonding layer is preferable to be ranging from about 5 μm to about 15 μm. In case the bonding layer is thinner than about 5 μm, it may sometimes result in reduction of the adhesion between the substrate 1 and the circuit pattern 6a, 6b.

Also, by using a multi-layer circuit board having four layers of circuit patterns using the double-side circuit boards, the connection resistance of the circuit board was measured in the same way as described above. As a result, the same as in the measurement of the above double-side circuit board, the connection resistance was uniform when the thickness of the bonding layer is in a range from about 5 μm to about 15 μm. Further, as the bonding layer increased in thickness, the resistance at the central position of the substrate became higher, causing the difference in thickness to become greater between the central position and the end position of the substrate.

In the present exemplary embodiment, the metallic foils 6a, 6b of the double-side circuit board are 12 μm in thickness. However, when a multi-layer circuit board is manufactured by using metallic foils thicker than 12 μm, it is preferable that the concavities of circuit patterns 7a, 7b be filled up with resin or the like in advance. That is, the surfaces can be flattened by filling up the concavities of circuit patterns 7a, 7b. In this way, the first bonding layer 2a of intermediate substrate 10a, 10b can be reduced in thickness. It is because the first bonding layer 2a that functions to fill up the concavities of circuit patterns 7a, 7b requires less quantity of resin. Accordingly, by using the first bonding layer 2a reduced in thickness, it is possible to make the connection resistance identical at all positions of the multi-layer circuit board.

The substrate used in the present embodiment is characterized in that the substrate has incompressibility. Therefore, it is possible to greatly reduce the dimensional strain generated in a step of pressure application for the manufacture of a circuit board. For example, the dimensional strain at the position of the multi-layer circuit board in the present embodiment is less than 1/5 of the strain in a conventional circuit board using a substrate having compressibility. As a result, the coincidence between via and land may be enhanced.

Preferably, the incompressible substrate contains resin. And, in the step of FIG. 1, preferably, the substrate is heated at a temperature higher than the glass transition temperature (Tg) of the resin contained. Thus, residual stresses generated during the manufacture of an incompressible substrate will be reduced. Accordingly, in the circuit board manufacturing process, the dimensional strain generated due to stresses will be reduced. Further, the coincidence between via and land is enhanced. As a result, the laminating accuracy between the double-side circuit board and intermediate substrate will be improved.

Exemplary Embodiment 2:

The second exemplary embodiment of the present invention for a method of manufacturing a circuit board will be described in the following.

Figure 5:
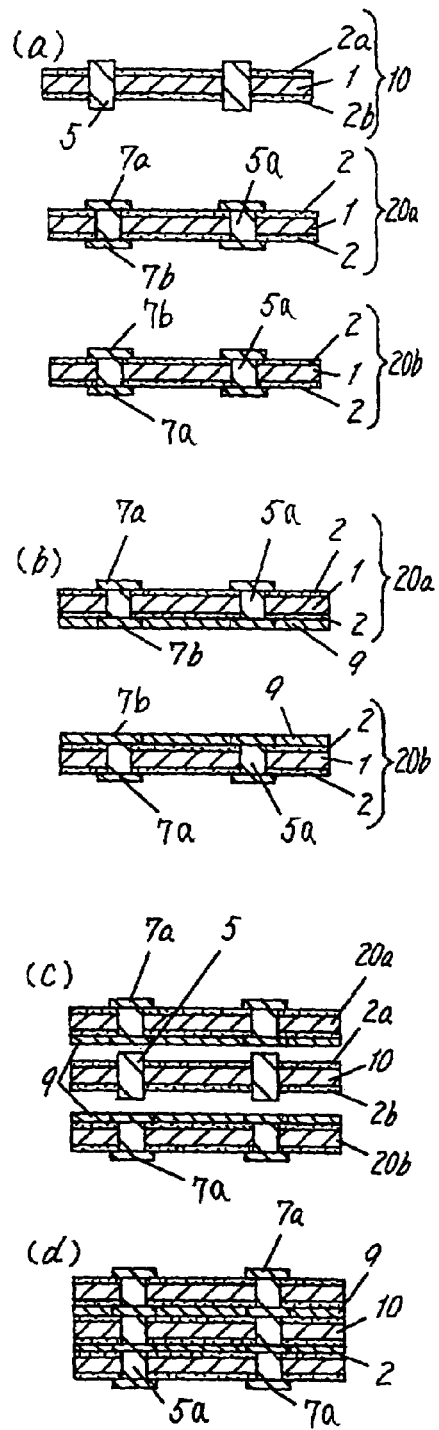
FIG. 5 is a sectional view of the process showing a method of manufacturing the second multi-layer circuit board of circuit boards in an embodiment of the present invention.

FIG. 5 is a sectional view of the process showing a method of manufacturing a multi-layer circuit board in the present exemplary embodiment, and the multi-layer circuit board has four layers of circuit patterns.

In FIG. 5(a), first double-side circuit board 20a, second double-side circuit board 20b, and insulating substrate 10 are prepared. These double-side circuit boards 20a, 20b are same in configuration as the double-side circuit board 20 manufactured in the first exemplary embodiment described above.

Intermediate substrate 10 is same in configuration as the intermediate substrate 10 manufactured in the first exemplary embodiment described above. That is, the intermediate substrate 10 comprises the incompressible substrate 1, bonding layers 2a, 2b disposed on either side of the substrate 1, and conductive paste 5 disposed in the through-hole. The conductive paste 5 is protruding from the through-hole. The bonding layers 2a, 2b are 10 μm thick and in a state of being half-cured at the B stage.

Next, as shown in FIG. 5(b), smoothing layer 9 is formed in concavities of second circuit pattern 7b on each of the double-side circuit boards 20a, 20b. The surface of the smoothing layer 9 is nearly the same in height as the surface of the second circuit pattern 7b.

The smoothing layer 9 is disposed in concavities by using a smoothing material. The smoothing material contains thermosetting resin and a solvent such as methyl ethyl ketone. The smoothing material is applied to concave portions by a squeezing process or the like, and is heated at a temperature of about 150° C. for two minutes. In this process, the solvent contained is volatilized and the thermosetting resin is hardened to a state of being half-cured at the B stage. Thus, the smoothing layer 9 is disposed. The smoothing layer 9 in a state of being half-cured is nearly the same in thickness as the circuit patterns 7a, 7b. For example, epoxy resin is employed as the thermosetting resin.

The following method can also be used as a method of disposing the smoothing layer 9. That is, epoxy resin is applied thicker than the circuit patterns 7a, 7b. And the epoxy resin is heated and cured. After that, the cured epoxy resin is polished to expose the surfaces of the circuit patterns 7a, 7b. In this way, the smoothing layer 9 is formed in same height as that of circuit pattern 7a, 7b. The smoothing layer 9 is disposed on the second circuit pattern side at one side of each double circuit board 20a, 20b.

Next, as shown in FIG. 5(c), the second double-side circuit board 20b, intermediate substrate 10, and first double-side circuit board 20a are positioned and laminated in this order. In this case, the second circuit pattern 7a having the smoothing layer 9 of each double-side circuit board 20a, 20b is laminated to the back of the intermediate substrate 10.

Also, as shown in FIG. 5(d), these laminated members are heated under pressures at a temperature of about 200° C. and a pressure of about 4 MPa for one hour in a vacuum or inert gas. Then, the bonding layer 2a, 2b of the intermediate substrate 10 and the smoothing layer 9 of the double-side circuit board 20a, 20b are cured. At the same time, the double-side circuit boards 20a, 20b are respectively laminated to the insulating substrate 10.

Further, the protruding conductive paste 5 is compressed, and simultaneously, the conductive paste in the through-hole is hardened to form through conductor 5a. The circuit patterns 7a, 7b of the double-side circuit board 20a establish inner via-hole connections with the circuit patterns 7a, 7b of the double-side circuit board 20b via the through conductors 5a. In this way, a multi-layer circuit board having four-layer circuit patterns can be obtained. By the bonding layers 2a, 2b disposed on either side of the intermediate substrate 10, the double-side circuit boards 20a, 20b are laminated to each other. Then, the circuit patterns 7a, 7b are electrically connected to each other by the through conductor 5a.

Also, by using a plurality of double-side circuit boards 20 and a plurality of intermediate substrates 10, a multi-layer circuit board having a plurality of circuit patterns may be manufactured by the same method as described above. In this case, a plurality of double-side circuit boards with intermediate substrates 10 sandwiched therebetween are laminated so that the double-side circuit board is formed as the outermost layer. Then, smoothing layer 7 is formed on the surface of double-side circuit board placed on the intermediate substrate. For example, a smoothing layer is formed on the inner side of the double-side circuit board located at the outermost position, and thereby, the smoothing layers are disposed on either side of the internally located double-side circuit board. In this way, a multi-layer circuit board having the desired number of circuit patterns may be manufactured.

The connection resistance was measured the same as in the first exemplary embodiment with respect to the multi-layer circuit board obtained in the present exemplary embodiment. Consequently, it has been confirmed that the connection resistance is identical at all positions of the circuit board. That is, stable and uniform contact resistance may be obtained at all positions of the circuit board. In addition, it has been confirmed that the coincidence between via and land is enhanced.

Exemplary Embodiment 3:

The third exemplary embodiment of the present invention for a method of manufacturing a circuit board will be described in the following.

Figure 6:
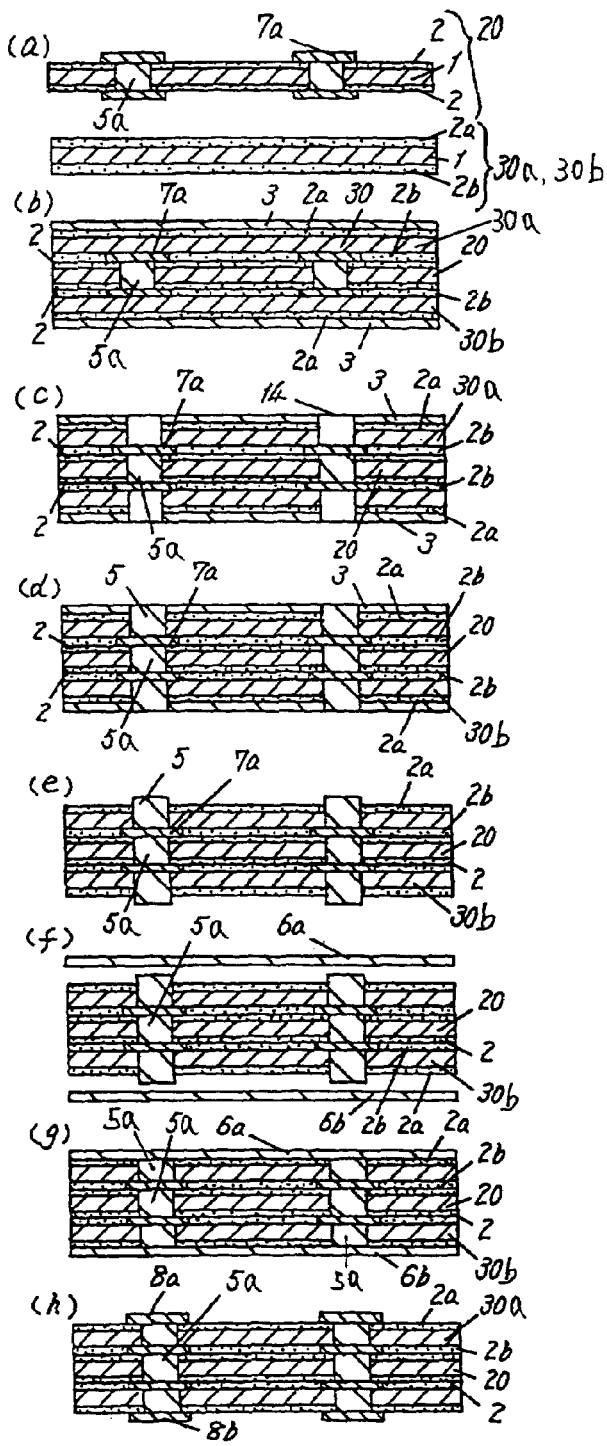
FIG. 6 is a sectional view of the process showing a method of manufacturing the third multi-layer circuit board of circuit boards in an embodiment of the present invention.

FIG. 6 is a sectional view of the process showing a method of manufacturing a multi-layer circuit board in an exemplary embodiment, and the multi-layer circuit board has four-layer circuit patterns.

As shown in FIG. 6(*a*), double-side circuit board 20, first bonding substrate 30a, and second bonding substrate 30b are prepared. As the double-side circuit board 20, a double-side circuit board 20 same as the double-side circuit board 20 manufactured in the first exemplary embodiment is employed. The double-side circuit board 20 comprises substrate 1, bonding layers 2 disposed on either side of the substrate 1, first circuit pattern 7a and second circuit pattern 7b bonded thereto by the bonding layer 2. Each of the circuit patterns 7a, 7b is about 12 μm in thickness. The first circuit pattern 7a and the second circuit pattern 7b are electrically connected to each other by through conductor 5a. The bonding substrate 30 includes the incompressible substrate 1 and the bonding layers 2a, 2b disposed on either side of the substrate 1. The bonding substrates 30a, 30b serve a function as an insulating material. Each of the bonding layers 2a, 2b contains epoxy resin of about 15 μm thick in the B stage.

Next, as shown in FIG. 6(*b*), the first bonding substrate 30a and the second bonding substrate 30b are generally positioned and laminated onto either side of the double-side circuit board 20. After that, releasing film 3 is disposed on each outermost side of the bonding substrates 30a, 30b. By heating to melt the bonding layers 2a, 2b, the releasing films 3 are bonded to the respective bonding materials. In that case, the bonding layers 2a, 2b of the bonding substrates 30a, 30b are kept in the B stage.

Also, as shown in FIG. 6(*c*), non-through-hole 14 is formed by using a laser beam machining process in recognition of circuit patterns 7a, 7b, and via so that the through-hole coincides with the circuit pattern 7a, 7b. The non-through-hole 14 is reaching the surface of the circuit pattern 7a, 7b. At the bottom of non-through-hole 14, the resin content of the bonding layer 2a is eliminated by laser, and the metal surface of the circuit pattern 7a, 7b is exposed at the bottom of non-through-hole 14. As the laser used for making holes, carbon dioxide gas laser or the like is employed since such laser is reverberated by the metal of the circuit pattern 7a, 7b.

After that, as shown in FIG. 6(*d*), conductive paste 5 is filled into the non-through-hole 14, using the releasing film 3 as a mask.

Next, as shown in FIG. 6(*e*), the releasing film 3 is removed from each outermost surface of the laminated body. With the releasing film 3 removed, the conductive paste 5 equivalent in thickness to the releasing film 3 is protruded from the outermost bonding layer 2a.

And, as shown in FIG. 6(*f*), metallic foils 6a, 6b of 12 μm thick are placed on either side of the laminated body. For example, copper is used as the metallic foil 6a, 6b. After that, the laminated members are heated under pressures at a temperature of about 200° C. and a pressure of about 4 MPa for one hour in a vacuum or inert gas.

Thus, as shown in FIG. 6(*g*), the bonding layers 2a, 2b of the respective bonding substrates 30a, 30b are cured, then the bonding substrates 30a, 30b, double-side circuit board 20, and respective metallic foils 6a, 6b are bonded to each other. At the same time, the protruding conductive paste 5 is compressed against the conductive paste in the through-hole and is hardened to form through conductor 5a. As a result, the metallic foils 6a, 6b establish inner via-hole connections with the respective circuit patterns 7a, 7b via the through conductor 5a formed in the non-through-hole 14.

Next, as shown in FIG. 6(*h*), the metallic foils 6a, 6b are selectively etched to form additional circuit patterns 8a, 8b. In this way, a circuit board having four-layer circuit patterns is obtained.

The multi-layer circuit board thus manufactured is identical in connection resistance at all positions thereof, same as in the first exemplary embodiment, and very stable in connection resistance. Further, the coincidence between via and land is enhanced.

Instead of the above double-side circuit board 20, a muti-layer circuit board having six-layer circuit patterns may be obtained, using the above four-layer circuit board, by performing the same process as described above. Similarly, instead of the double circuit board 20, a multi-layer circuit board having eight-layer circuit patterns may be obtained, using the above six-layer circuit board, by performing the same process as described above.

Thus, a circuit board having four or more layers of circuit patterns may be obtained by using the method of the present exemplary embodiment.

In the first, second and third exemplary embodiments described above, a material ensuring electrical insulation is used as an incompressible substrate. For example, as the incompressible substrate, a mixture of resin and filler or a ceramic material is employed. As the filler, organic or inorganic material powder, or fiber is employed.

Preferably, the substrate includes fiber aggregate, and thermosetting resin impregnated to the fiber aggregate.

Further preferably, the fiber aggregate used is non-woven fabric or woven fabric of fiber such as aromatic polyamide fiber, ceramic fiber, and glass fiber. These materials as substrates are already compressed and formed. That is, when the incompressible substrate is subjected to pressures, the substrate remains unchanged in thickness without being compressed.

For example, a composite material of non-woven fabric of aromatic polyamide fiber and thermosetting epoxy resin impregnated to the non-woven fabric or a composite material of glass fiber fabric and thermosetting epoxy resin impregnated to the fabric is used as a preferable material.

For example, such composite material of glass fabric and epoxy resin sandwiched between metallic foils was heated under pressures. After that, the composite material thus formed was etched to remove the metallic foils, thereby forming a substrate. By using the substrate, a multi-layer circuit board was manufactured in the same way as in the first exemplary embodiment described above. For the multi-layer circuit board, the connection resistance was measured the same as in the first exemplary embodiment. As a result, it has been confirmed that the same advantages as in the first exemplary embodiment can be obtained.

Also, in the manufacture of a double-side circuit board in the first, second, and third exemplary embodiments, it is possible to use a double-side board in which through-holes are made by drilling and the through conductor is, for example, a metal deposited by electroplating. By using such double-side circuit board, it is possible to obtain a circuit board having smoother surfaces. Also in this case, the advantages obtained are same as in the first, second and third exemplary embodiments.

By the configuration as described above, stable connection resistance can be obtained at all positions of the circuit board. Further, the laminating accuracy of the circuit patterns is improved and, in addition, the coincidence between through conductor and circuit pattern is enhanced. As a result, a circuit board having excellent electrical characteristics may be obtained.

What is claimed is:

1. A method of manufacturing a circuit board, comprising the steps of:
   (a) manufacturing an intermediate substrate, including the steps of:
      (i) manufacturing a substrate having incompressibility,
      (ii) forming bonding layers on either side of said substrate,
      (iii) forming a plurality of through-holes in said substrate, and
      (iv) filling conductive paste into said through-holes; and
   (b) manufacturing a double-side circuit board, including the steps of:
      (v) laminating metallic foils to either side of said intermediate substrate and heating same under pressures, and
      (vi) forming a first circuit pattern and a second circuit pattern by processing said metallic foils.

2. The method of manufacturing a circuit board of claim 1,
   wherein the step of manufacturing said substrate comprises a step of heating under pressures a composite material consisting of fiber aggregate and thermosetting resin impregnated to said fiber aggregate.

3. The method of manufacturing a circuit board of claim 2,
   wherein said fiber aggregate contains at least one selected from the group consisting of inorganic fiber, ceramic fiber, organic fiber, and glass fiber.

4. The method of manufacturing a circuit board of claim 1,
   wherein the step of forming said bonding layer comprises the steps of:
   laminating releasing films having a film material and adhesive disposed on said film material to either side of said substrate; and
   removing only said film material from said substrate,
   whereby said bonding layers are disposed on either side of said substrate.

5. The method of manufacturing a circuit board of claim 1,
   wherein the step of manufacturing said intermediate substrate comprises the steps of:
   disposing said bonding layer and film on either side of said substrate;
   then, forming a plurality of through-holes in said substrate with said bonding layer and said film disposed thereon;
   then, filling conductive paste into said through-holes, using the film as a mask; and
   removing thereafter said film.

6. The method of manufacturing a circuit board of claim 5,
   wherein said bonding layer remains on the surface of said substrate with said film material removed; and
   said conductive paste equivalent in thickness to said film material is protruded from said bonding layer.

7. The method of manufacturing a circuit board of claim 1,
   wherein said bonding layer in the above step (ii) is formed in a state of being half-cured.

8. The method of manufacturing a circuit board of claim 1, further comprising the steps of:
   (c) laminating a first intermediate substrate and a second intermediate substrate sandwiching therebetween a double-side circuit board manufactured in the above step (b), laminating a third metallic foil to the surface of said first intermediate substrate, and laminating a fourth metallic foil to the surface of said second intermediate substrate,
   said first intermediate substrate and second intermediate substrate being same in configuration as said intermediate substrate manufactured in the above step (a);
   (d) heating under pressures said third metallic foil, said first intermediate substrate, said double-side circuit board, said second intermediate substrate, and said fourth metallic foil which are laminated; and
   (e) forming a third circuit pattern and a fourth circuit pattern by processing said third metallic foil and said fourth metallic foil, thereby manufacturing a four-layer circuit board.

9. The method of manufacturing a circuit board of claim 8, wherein each of said first intermediate substrate and said second intermediate substrate has a protrusion of said conductive paste protruded from the surface of said bonding layer, and in the above step (d), the protrusion of said conductive paste is compressed, and said metallic foils disposed on either side of said intermediate substrates are electrically connected to each other by said conductive paste in said through-holes.

10. The method of manufacturing a circuit board of claim 1, further comprising the steps of:

(f) laminating a first double-side circuit board and a second double-side circuit board sandwiching therebetween a first intermediate substrate, said first double-side circuit board being said double-side circuit board, said second double-side circuit board being same in configuration as said double-side circuit board, and said intermediate substrate being same in configuration as said intermediate substrate manufactured in the above step (a); and (g) heating under pressures said first double-side circuit board, said intermediate substrate, and said second double-side circuit board which are laminated.

11. The method of manufacturing a circuit board of claim 1, further comprising the steps of:

(h) manufacturing a first bonding substrate and a second bonding substrate, said first bonding substrate and said second bonding substrate having bonding layers disposed on either side of a first substrate, and said first substrate having incompressibility;

(i) laminating said first bonding substrate and said second bonding substrate sandwiching there between said double-side circuit board manufactured in the above step (b), laminating a third metallic foil to the surface of said first bonding substrate, and laminating a fourth metallic foil to the surface of said second boding substrate, laminating a first bonding layer and a first releasing film to the surface of said third metallic foil, and laminating a second bonding layer and a second releasing film to the surface of said fourth metallic foil;

(j) forming a plurality of non-through-holes in each of said first substrate, said first film, said second substrate, and said second film;

(k) filling conductive paste into said non-through-holes;

(l) removing said first film and said second film respectively from said bonding layers in a manner such that said first bonding layer and said second bonding layer respectively remain on said first substrate and said second substrate;

(m) disposing a third metallic foil on said first bonding layer, and disposing a fourth metallic foil on said second bonding layer;

(n) heating under pressures said third metallic foil, said first bonding substrate, said double-side circuit board, said second bonding layer, and said fourth metallic foil which are laminated; and (o) forming a third circuit pattern and a fourth circuit pattern by processing said third metallic foil and said fourth metallic foil, thereby manufacturing a four-layer circuit board.

12. The method of manufacturing a circuit board of claim 8, further comprising the steps of:

(h) manufacturing a first bonding substrate and a second bonding substrate, said first bonding substrate and second bonding substrate having bonding layers disposed on either side of a first substrate, and said first substrate having incompressibility;

(p) laminating said first bonding substrate and said second bonding substrate sandwiching therebetween said four-layer circuit board manufactured in the above step (e), laminating a third metallic foil to the surface of said first bonding substrate, and a fourth metallic foil to the surface of said second boding substrate, laminating a first bonding layer and a first releasing film to the surface of said third metallic foil, and laminating a second bonding layer and a second releasing film to the surface of said fourth metallic foil;

(q) forming a plurality of non-through-holes in each of said first substrate and said first film, and said second substrate and said second film;

(r) filling conductive paste into said non-through-holes;

(s) removing said first film and said second film respectively from said bonding layers in a manner such that said first bonding layer and said second bonding layer respectively remain on said first substrate and said second substrate;

(t) disposing a third metallic foil on said first bonding layer, and disposing a fourth metallic foil on said second bonding layer;

(u) heating under pressures said third metallic foil, said first bonding substrate, said four-layer circuit board, said second bonding layer, and said fourth metallic foil which are laminated; and (v) forming a third circuit pattern and a fourth circuit pattern by processing said third metallic foil and said fourth metallic foil, thereby manufacturing a four-layer circuit board.

13. The method of manufacturing a circuit board of claim 1, wherein the step of manufacturing said intermediate substrate comprises a step of filling said conductive paste into said through-holes in a manner such that said conductive paste includes a protrusion from the surface of said bonding layer, and in the above step (v), the protrusion of said conductive paste is compressed by said metallic foil, and said metallic foils disposed on either side of said intermediate substrates are electrically connected to each other by said conductive paste in said through-holes.

14. The method of manufacturing a circuit board of claim 1, wherein said bonding layer is in a range of about 5 $\mu$m to about 15 $\mu$m in thickness.

15. The method of manufacturing a circuit board of claim 1, wherein the bonding layers disposed on either side of said substrate are different in thickness.

16. The method of manufacturing a circuit board of claim 1, wherein the step of forming a substrate having incompressibility further comprises a step of roughening the surface of said substrate before forming said bonding layer.

17. The method of manufacturing a circuit board of claim 1, wherein the step of forming a substrate having incompressibility further comprises a step of eliminating residual stresses.

18. The method of manufacturing a circuit board of claim 1, wherein the step of forming a substrate having incompressibility further comprises a step of heat-treating said substrate at the glass transition temperature of resin contained in said substrate, whereby residual stresses of said substrate are eliminated.

19. The method of manufacturing a circuit board of claim 1, further comprising the step of:

(w) disposing a smoothing layer on the bonding layer in concavities of at least one circuit pattern of said first circuit pattern and said second circuit pattern of said double-side circuit board.

20. The method of manufacturing a circuit board of claim 19, wherein said smoothing layer contains resin.

21. The method of manufacturing a circuit board of claim 8, further comprising the step of:

(x) forming a smoothing layer on the bonding layer in concavities of at least one circuit pattern of said first circuit pattern and said second circuit pattern of at least one double-side circuit board of said first double-side circuit board and said second double-side circuit board, wherein the smoothing layer side is placed on said first intermediate substrate.

22. The method of manufacturing a circuit board of claim 21, wherein the process of forming said smoothing layer comprises the steps of:

forming half-cured resin in the concavities, and laminating said double-side circuit board having said smoothing layer containing the half-cured resin to said first intermediate substrate.

* * * * *